(12) United States Patent
Gao

(10) Patent No.: US 11,765,858 B2
(45) Date of Patent: Sep. 19, 2023

(54) MULTI-SYSTEM COOLING DEVICE FOR HIGH POWERED INTEGRATED CIRCUITS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 41 days.

(21) Appl. No.: 17/356,881

(22) Filed: Jun. 24, 2021

(65) Prior Publication Data
US 2022/0418159 A1 Dec. 29, 2022

(51) Int. Cl.
*H05K 7/20* (2006.01)
*F28D 21/00* (2006.01)
*H01L 23/46* (2006.01)

(52) U.S. Cl.
CPC ..... *H05K 7/20272* (2013.01); *H05K 7/20281* (2013.01); *H05K 7/20772* (2013.01); *F28D 2021/0029* (2013.01); *H01L 23/46* (2013.01)

(58) Field of Classification Search
None
See application file for complete search history.

(56) References Cited

U.S. PATENT DOCUMENTS

| | | | | |
|---|---|---|---|---|
| 5,896,922 A | * | 4/1999 | Chrysler | F25B 41/20 165/146 |
| 2007/0215325 A1 | * | 9/2007 | Solovitz | H01L 23/473 257/E23.098 |
| 2017/0055378 A1 | * | 2/2017 | Zhou | H05K 7/20927 |
| 2021/0267096 A1 | * | 8/2021 | Heydari | H05K 7/20254 |
| 2021/0368656 A1 | * | 11/2021 | Heydari | H05K 7/20836 |
| 2022/0043413 A1 | * | 2/2022 | Heydari | H05K 7/2079 |
| 2022/0071063 A1 | * | 3/2022 | Heydari | H05K 7/20836 |
| 2022/0240421 A1 | * | 7/2022 | Zhang | H05K 7/20772 |
| 2022/0264772 A1 | * | 8/2022 | Heydari | F28F 13/00 |
| 2022/0330458 A1 | * | 10/2022 | Heydari | H05K 7/20381 |
| 2022/0346265 A1 | * | 10/2022 | Heydari | G06F 1/26 |
| 2022/0346285 A1 | * | 10/2022 | Heydari | H05K 7/20809 |

\* cited by examiner

*Primary Examiner* — Courtney L Smith
(74) *Attorney, Agent, or Firm* — WOMBLE BOND DICKINSON (US) LLP

(57) ABSTRACT

A thermal management plate includes two cooling devices. A first cooling device includes a fluid inlet, a fluid outlet, a distribution manifold, and a number of fluid channels extending from the distribution manifold. The second cooling device also includes a fluid inlet, a fluid outlet, a distribution manifold, and a number of fluid channels extending from the distribution manifold. The channels of the first cooling device and the channels of the second cooling device are in thermal communication with one another, and the two channels are designed jointly.

20 Claims, 8 Drawing Sheets

MULTI-SYSTEM COOLING DEVICE FOR HIGH POWERED INTEGRATED CIRCUITS

FIELD OF THE DISCLOSURE

Embodiments of the present invention relate generally to server and electronic cooling systems. More particularly, embodiments of the invention relate to a multi-system cooling device.

BACKGROUND

Electronics cooling is an important market for computing hardware and other electronic devices, such as CPU servers, GPU servers, storage servers, networking equipment, edge and mobile systems, on-vehicle computing boxes and so on. Cooling of these electronics becomes more and more challenge to ensure they function properly by constantly providing designed thermal environments. Previous solutions for cooling electronics components and implementing thermal management for processors do not provide redundancy at the module level, which means that they have a single failure point. A need, therefore, exists for a fully redundant design on the device level.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
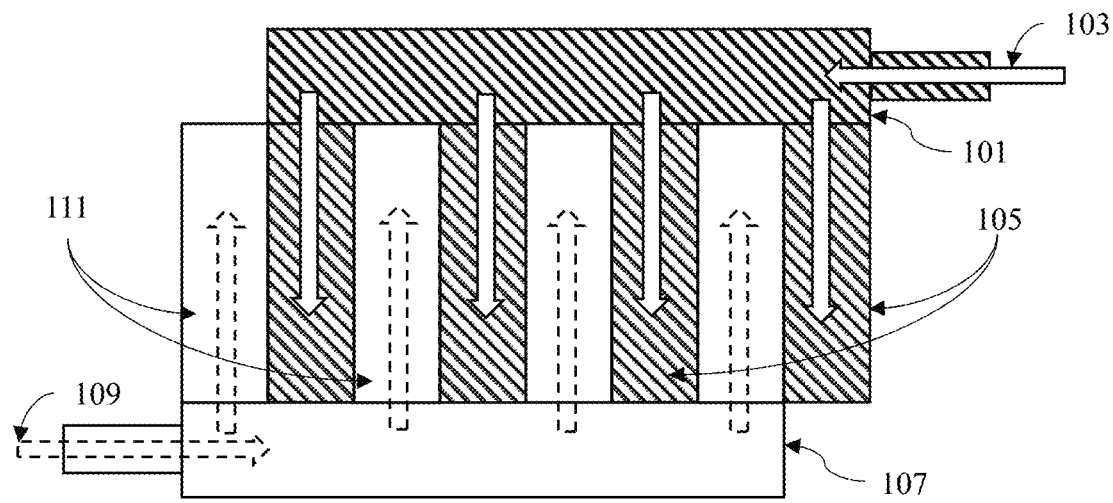
FIG. 1 shows a plan view of a cooling system, according to an embodiment of the present disclosure.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In the description of the embodiments provided herein, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other. Additionally, the terms "server," "client," and "device" are intended to refer generally to data processing systems rather than specifically to a particular form factor for the server, client, and/or device.

Embodiments described herein provide for a redundant cooling system that includes multiple independent cooling devices. The solution disclosed herein significantly increases the device fabrication efficiency, and provides flexibility to be used in different system cooling architectures using different cooling fluids.

According to some embodiments, the techniques disclosed herein provide an advanced solution for critical processors to solve a number of non-trivial challenges. These advantages include: high power density thermal management for critical processors, redundancy on the cooling module level, high system reliability, lower dependency on system control or sensors, ease of installation and service, and compatibility with different system/facility infrastructures and cooling fluids. Furthermore, the systems disclosed herein allow for different system level integration, including single phase 1+1, two phase 1+1, single phase+two phase, natural single phase+pumped two phase, etc.

Electronics cooling is an important market, since it is a fundamental technology for new chips and electronics, and it provides a basic thermal environment for proper design and operation. It is seen that thermal management is becoming more and more critical for high performance processors. As computing hardware and processors become more and more expensive, cooling reliability is critical to prevent any potential damage to expensive components.

In an embodiment, a hybrid cooling device design and architecture is proposed that includes two cooling devices or cooling sections. In one embodiment, the two cooling devices can be similar in terms of shape and form factors. Each of the two cooling devices is designed with a distribution manifold and a number of fluid channels (e.g. microchannels) for fluid recirculation. Each of the distribution manifolds can be designed with fluid and coolant inlet and outlet ports that can be connected with a coolant source. In one embodiment, the cooling channels of the two cooling devices can fit together in an alternating pattern or arrangement, such that the channels of the two devices are interlaced. The cooling channels of each cooling device can be combined such that each channel of one device is in contact with, or in close proximity with, at least one channel of the other device. This provides an amount of thermal transmission between the cooling channels of both devices. In one embodiment, the two sections can be fabricated on a single base, with individual channels and distribution channels etched.

System Overview

FIG. 1 shows a plan view of a cooling system, according to an embodiment of the present disclosure. In this embodiment, the cooling system has two cooling devices or portions, including the first cooling device 101 and the second cooling device 107. The first cooling device 101 is configured to receive a first fluid flow 103, and direct fluid to a number of cooling channels 105. In this example embodiment four cooling channels are shown, although one skilled in the art would recognize that any suitable number of cooling channels can be used, and the present disclosure is not limited to any particular number of channels. Each of the cooling channels 105 are only fluidly connected to the first fluid flow 103, in this embodiment.

The second cooling device 107 is configured to receive a second fluid flow 109, and direct fluid to a number of cooling channels 111. Each of the cooling channels 111 are only fluidly connected to the second fluid flow 109, in this embodiment. The two cooling devices 101, 107 are assembled together, and they are designed and shaped to match with one another so that the cooling channels are in contact with one another and alternate between the channels of the first cooling device 101 and the second cooling device 107. The cooling devices 101, 107 are also designed with separate fluid systems, such that they do not have any fluid connection between each other, and one system can function as a single phase cooling system while the other functions as a two-phase cooling system. The dimensions of the channels 111 and 105 can be in different such as one is larger than the other for different cooling applications. However, the space between each two of channels 111 and each two of the channels 105 should be designed based on the dimension of 105 and 111 respectively, to ensure the two pieces can be assembled together.

Figure 2:
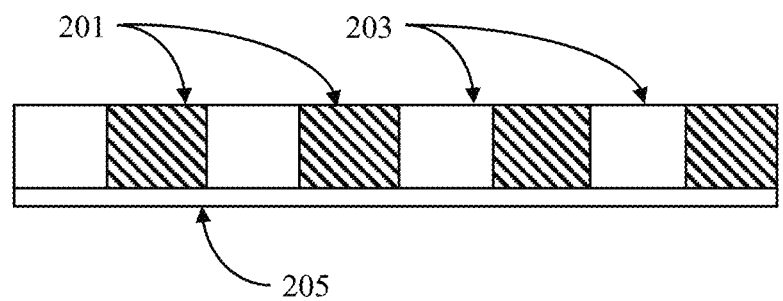
FIG. 2 shows a cross sectional side view of a cooling system, according to an embodiment of the present disclosure.

FIG. 2 shows a cross sectional side view of a cooling system, according to an embodiment of the present disclosure. In this embodiment, it can be seen that the channels of the first cooling device 201 and the channels of the second cooling device 203 are arranged in a staggered manner above an electronic chip 205. This helps manage and dissipate heat from the chip 205. In this example embodiment, the channels are arranged in a staggered manner such as 12121212. In other embodiments, the channels can be arranged in a more complex partially staggered arrangement, such as 1221221221. One skilled in the art will appreciate that additional channel arrangement can be designed, and each channel does not need to be substantially straight, as shown in FIG. 2. For example, in some embodiments, interlacing curved or bending channel designs can be utilized.

In one embodiment, one set of channels can be operated with single phase fluid, while the other set of channels operates with a phase change fluid. In some embodiments, both the single phase system and the phase change system can be operated simultaneously in order to provide increased cooling. In other embodiments, one device can operate as the default or standard cooling device, while the other device serves as a backup. With a variation of the channel dimensions, the redundant performance can be designed differently.

Figure 3:
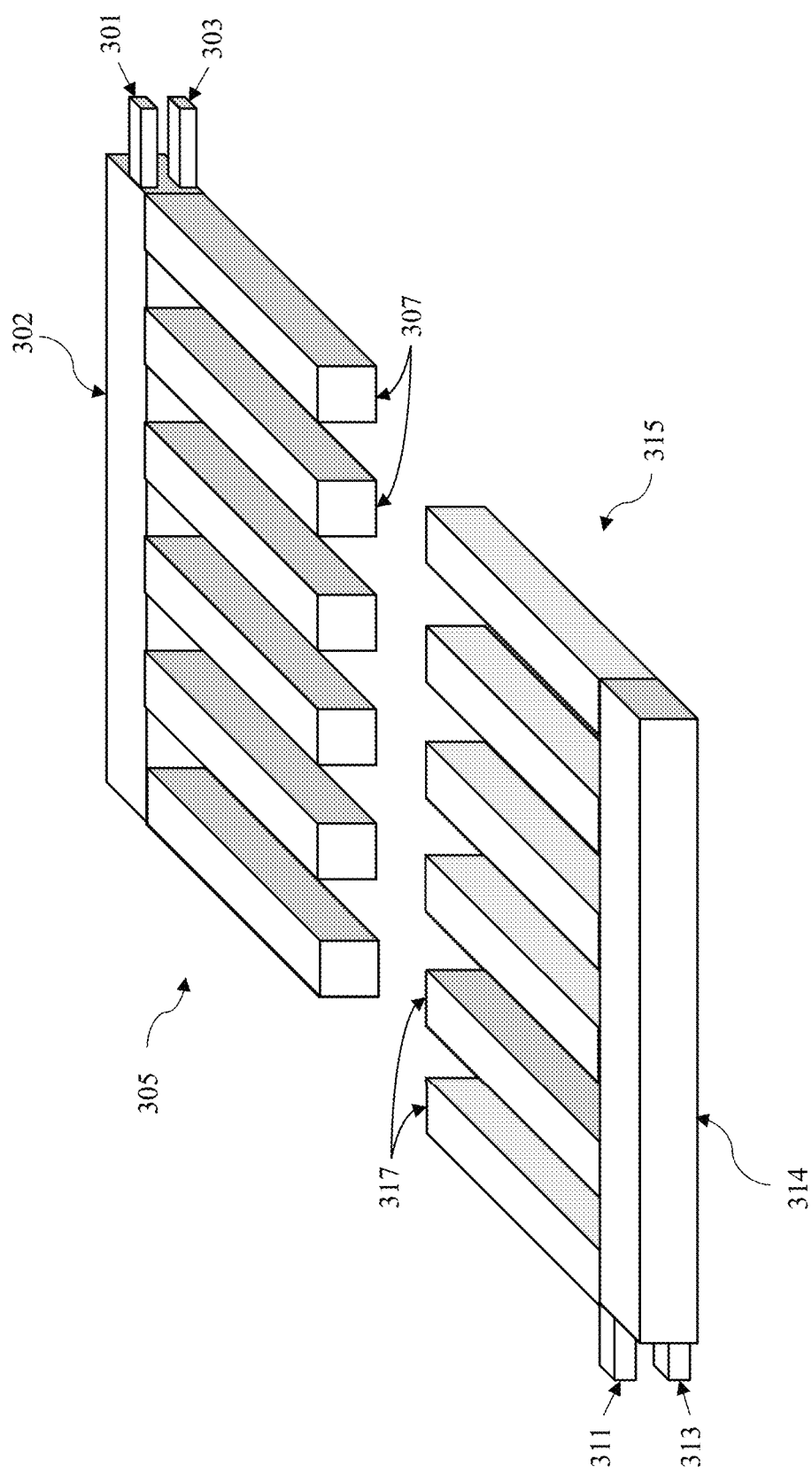
FIG. 3 shows an exploded view of the two cooling devices of a cooling system, according to an embodiment of the present disclosure.

FIG. 3 shows an exploded view of the cooling devices of a cooling system, according to an embodiment of the present disclosure. In this embodiment, it can be seen that the proposed cooling device may be fabricated separately, including a first cooling device 305 and a second cooling device 315. In one example embodiment, the first cooling device 305 can be a single phase device, which includes a fluid inlet port 301 and a fluid outlet port 303, and with a number of fluid channels 307 connected to a distribution manifold 302. In one example embodiment, the second cooling device 315 can be a two-phase cooling device, including a coolant inlet 311 for receiving a liquid coolant, and a vapor outlet 313 for channeling the vaporized or partially vaporized coolant to a condenser, or other external system. The second cooling device 315 also includes a distribution manifold 314 connected to a number of phase-change channels 317.

In one embodiment, once assembled, the channels 307, 317 are in thermal communication with one another in order to facilitate heat transfer. The channels 307, 317 may be in physical contact with one another, or a thermal transfer material may be used. The channels 307, 317 may be formed of a thermally conductive material, such as metal, and each of the channels can be in thermal communication with at least one channel from the other device. In some embodiments, the fluid ports such as 301 and 303, 311 and 313 can be located in different locations for ease of pipe installation and fluid management.

Figure 4:
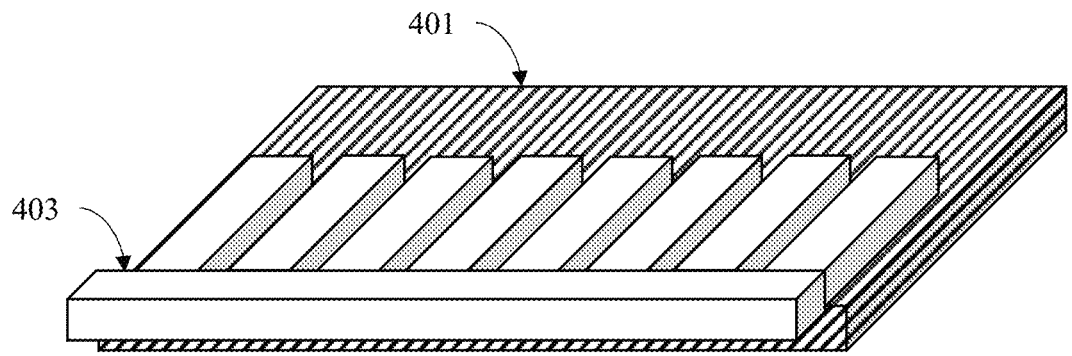
FIG. 4 shows a perspective view of a cooling system machined from a base, according to an embodiment of the present disclosure.

FIG. 4 shows a perspective view of a cooling system machined from a base 401, according to an embodiment of the present disclosure. In this example embodiment, the cooling device 403, including the sets of channels and fluid distribution manifold, can be fabricated or machined on a single base.

Figure 5:
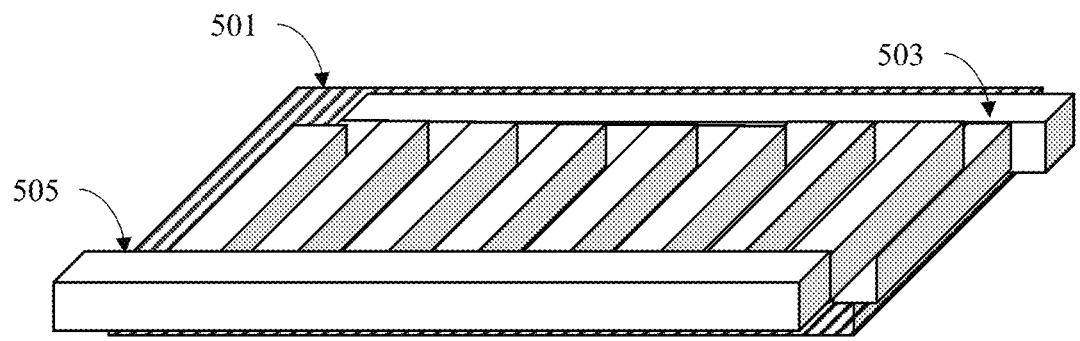
FIG. 5 shows a perspective view of another cooling system machined from a base, according to an embodiment of the present disclosure.

FIG. 5 shows a perspective view of another cooling system machined from a base 501, according to an embodiment of the present disclosure. In this example embodiment, both a first cooling device 503 and a second cooling device 505 can be seen formed upon the base 501.

In an embodiment where the cooling devices are fabricated on a single base, the whole device is one single unit, including separate sets of fluid systems. This can provide increased thermal transfer away from a processing device, thus improving performance and efficiency. The detailed designs of the channels can be optimized based on the die on the chip, in order to achieve thermal management optimization.

Figure 6:
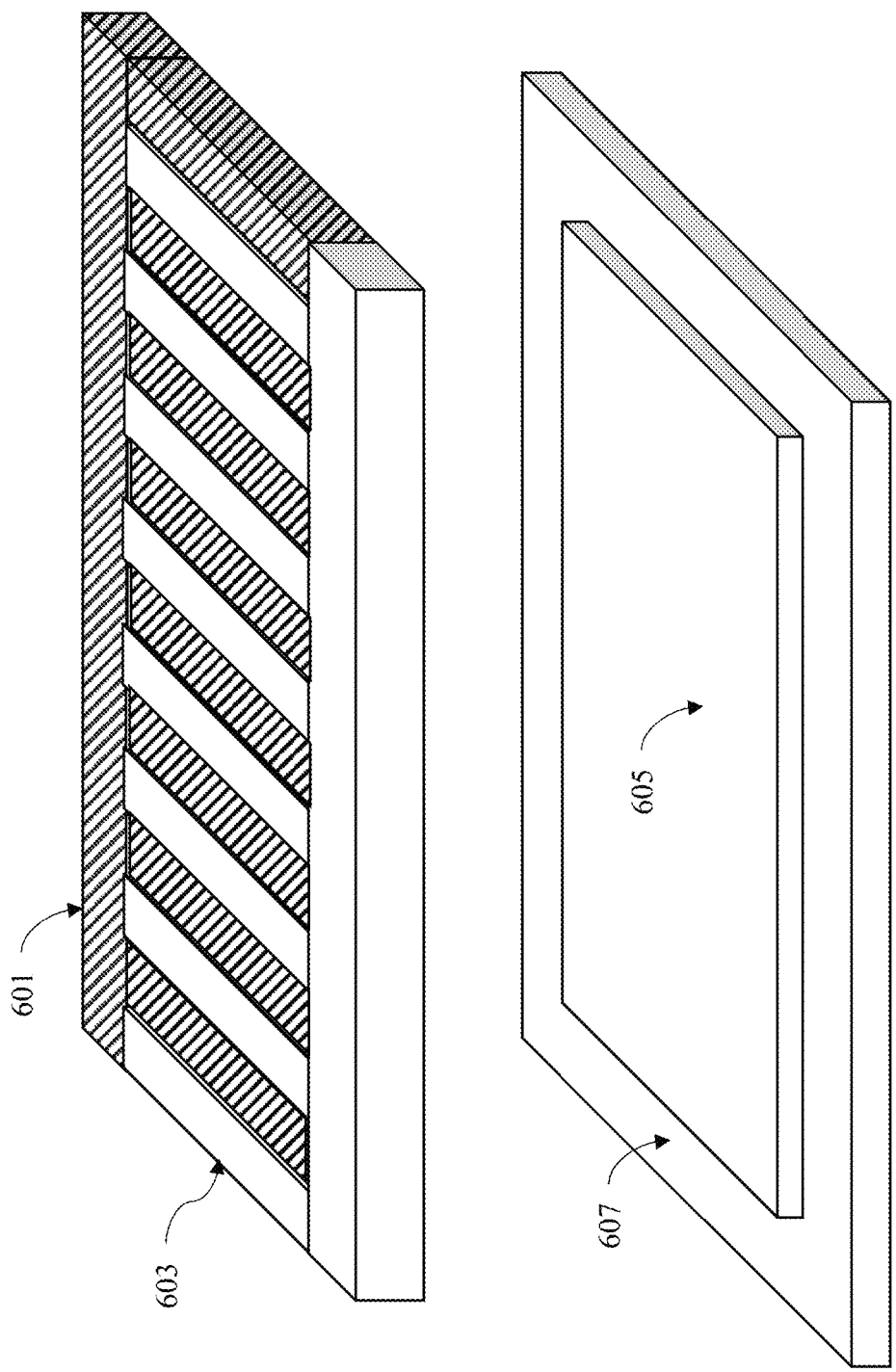
FIG. 6 shows a perspective view of two cooling devices above an electronic chip, according to an embodiment of the present disclosure.

FIG. 6 shows a perspective view of two cooling devices above an electronic chip, according to an embodiment of the present disclosure. In this embodiment, a first cooling device 601 and second cooling device 603 are shown assembled together, and positioned over a die 605 and chip 607. The cooling module shown in this figure can be understood as two separate sections that are joined together, or as a single all-in-one design as discussed in reference to FIGS. 4-5.

As will be appreciated, some detailed fluid channels and internal architecture are not shown in detail in each and every figure of the present application. The connection of the channels of the two sections 601, 603 can be either through some type of thermal interface materials, or simply by directly contacting the channels. In one embodiment, however, it is not necessary that the sets of channels be physically connected in order to be thermally connected or provide thermal transfer. In the example shown in FIG. 6, the channels of the two sections 601, 603 join together in a staggered manner within a single plane, with the first fluid channels extending from the first distribution manifold and between the second fluid channels. In this way, they can both be positioned flush on the surface of the die 605.

Figure 7:
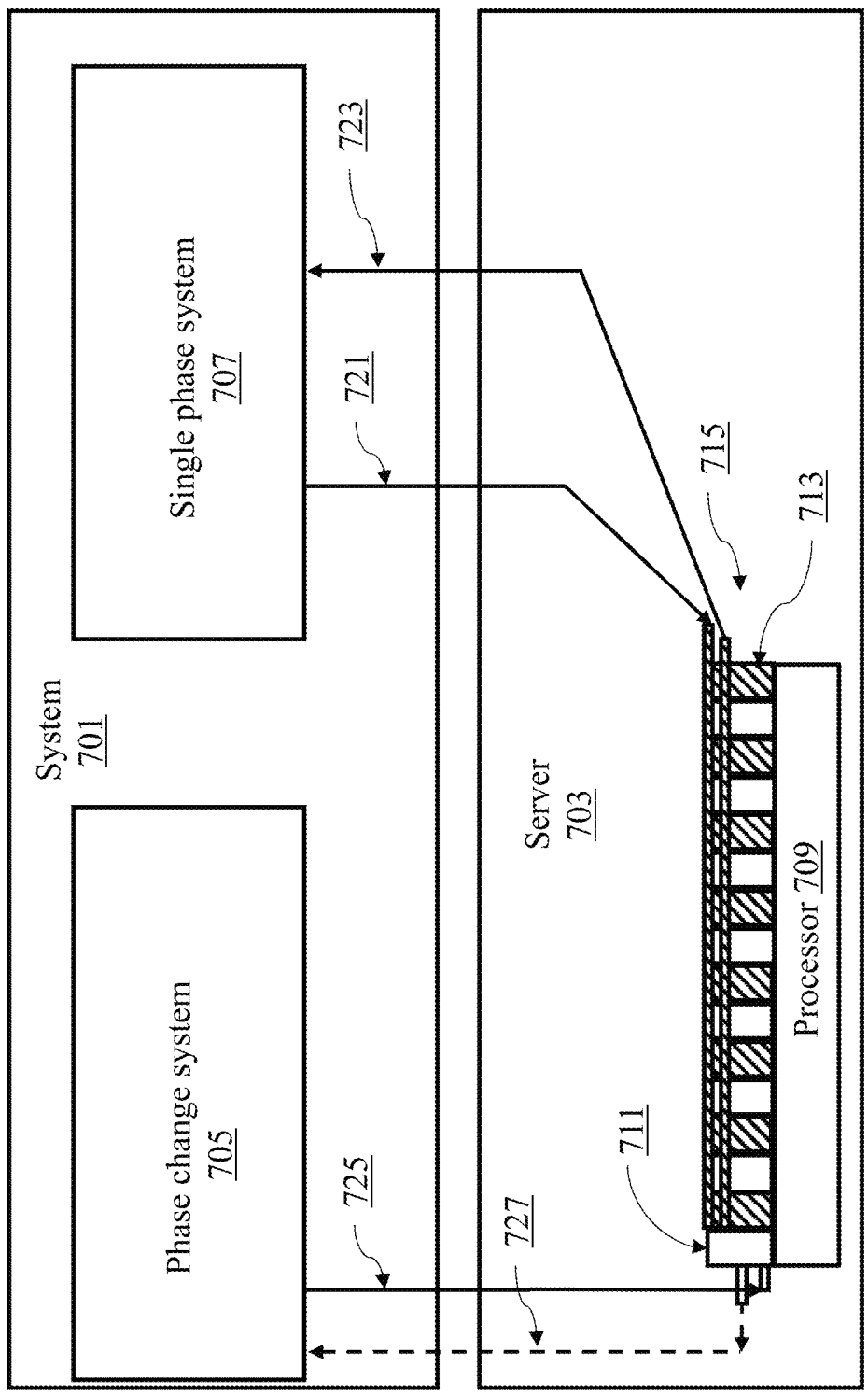
FIG. 7 shows a block diagram of a hybrid cooling system, according to an embodiment of the present disclosure.

FIG. 7 shows a block diagram of a hybrid cooling system 701, according to an embodiment of the present disclosure. In this embodiment, the hybrid cooling system 701 includes a phase change system 705, along with a single phase system 707, that are both in communication with a hybrid thermal management plate 715 disposed on a processor 709 within a server 703.

As shown in FIG. 7, the single phase system 707 includes a fluid supply 721 and a fluid return 723 that can transfer a coolant fluid between to and from a single phase area 713. Similarly, the phase change system 705 includes a fluid supply 725 and a vapor return 727 that can transfer fluid to and from a phase change area 711. On the device level, adjusting the two systems can enable a solution to be developed and operated properly. In addition, the detailed design of such a cooling device enables both a chip-level and system-level customization to achieve an optimal design. As described before, the channel dimensions can be different, especially for a single phase and phase change system, such as 715 is smaller than 713.

Figure 8:
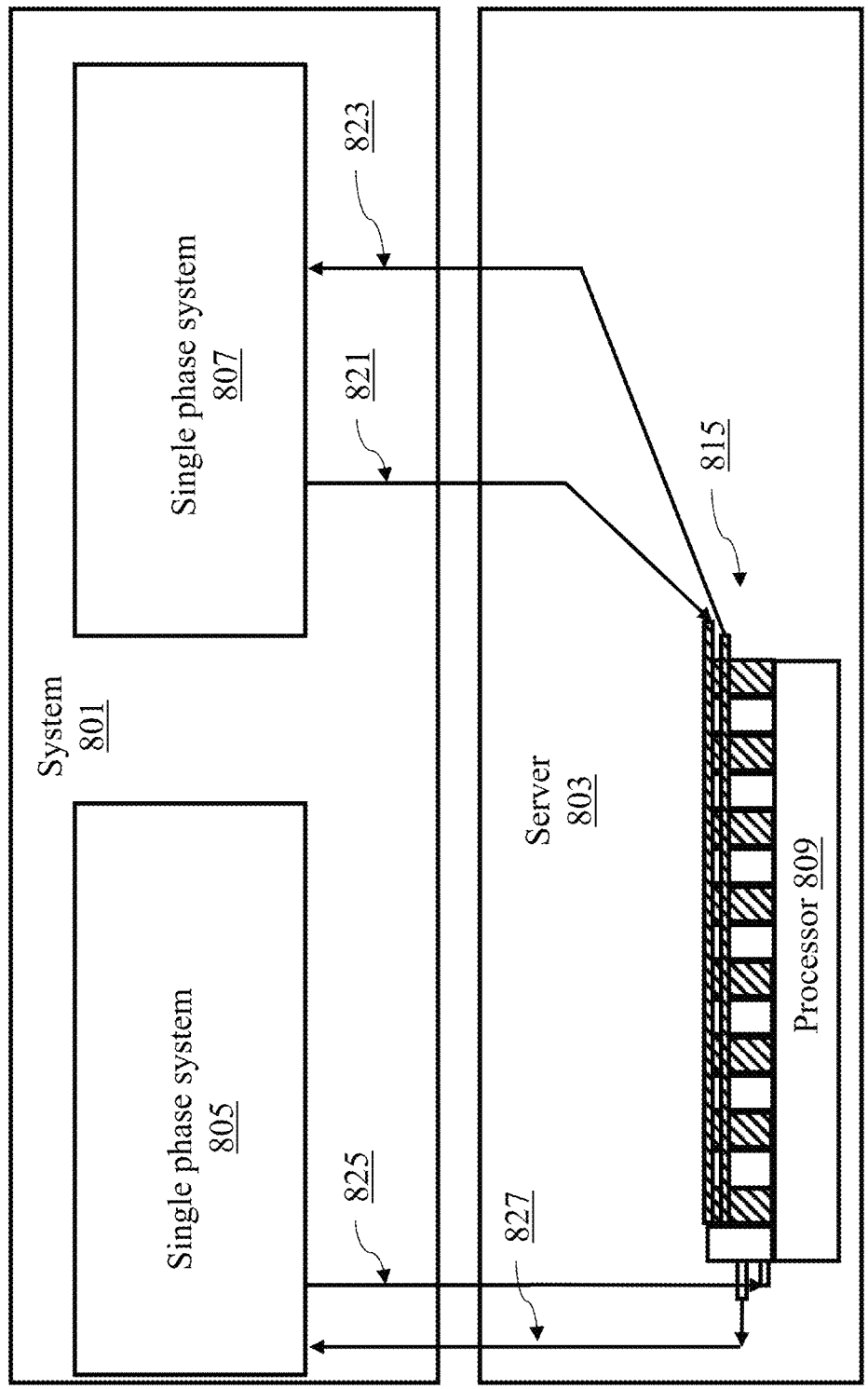
FIG. 8 shows a block diagram of a server cooling system, according to an embodiment of the present disclosure.

FIG. 8 shows a block diagram of a server cooling system, according to an embodiment of the present disclosure. In this embodiment, a twin single phase system 801 is shown, that includes a first single phase system 805 and a second single phase system 807 that can transfer coolant to and from a cooling plate 815 disposed on a processor 809 within a server 803. Since both systems are single phase systems, the first single phase system 805 is outfitted with a fluid supply 825 and a fluid return 827, and the second single phase system 807 is also outfitted with a fluid supply 821 and a fluid return 823. This system may be considered as a redundant system for operating critical chips or integrated circuits. In some embodiments, the individual sections of the cooling device can be identical, or can be different to accommodate actual use cases. As will be appreciated, the single phase systems disclosed herein may include liquid cooling devices or systems in order to cool liquid prior to directing it to the cooling plate 815.

Figure 9:
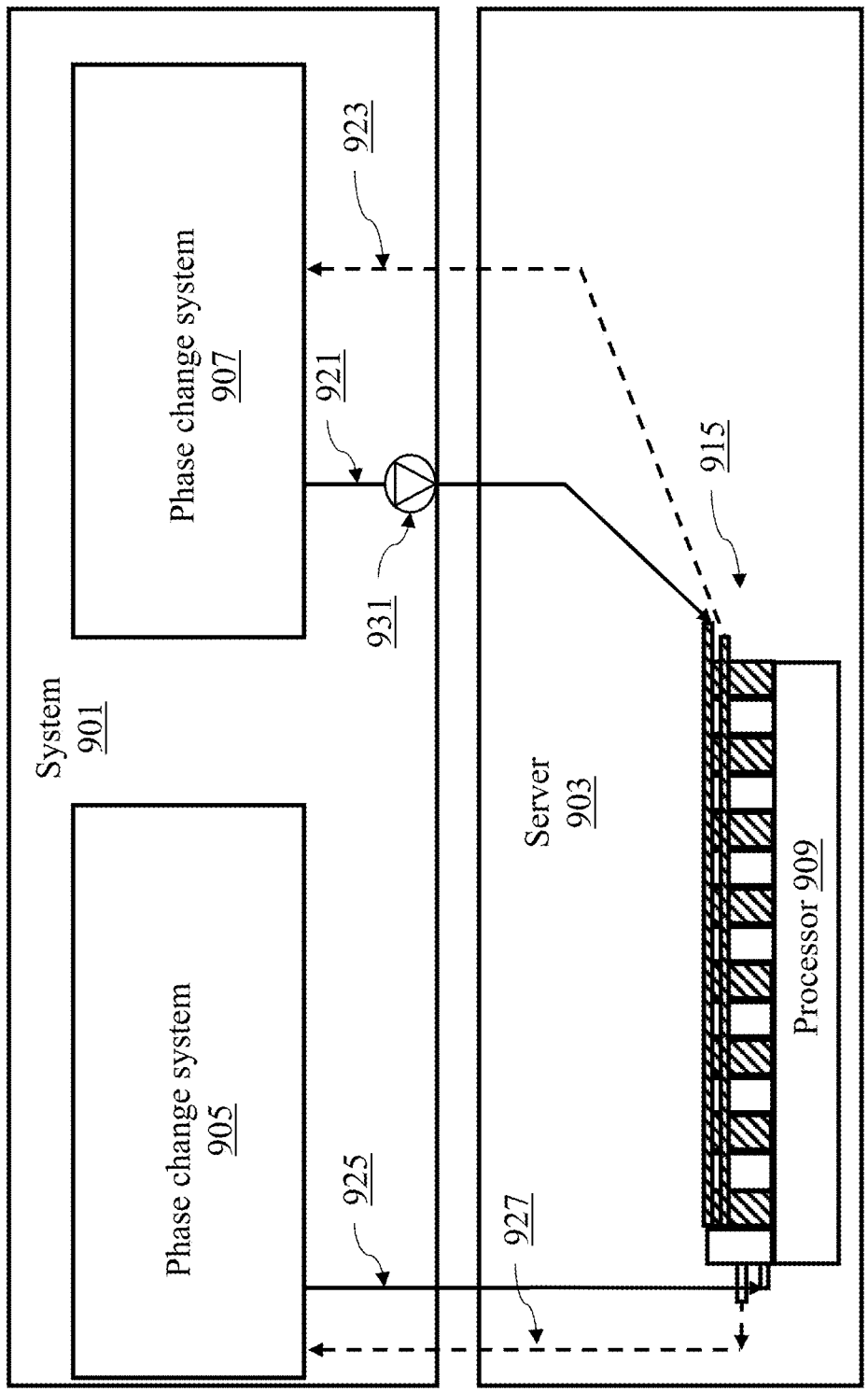
FIG. 9 shows another block diagram of a server cooling system, according to an embodiment of the present disclosure.

FIG. 9 shows another block diagram of a server cooling system, according to an embodiment of the present disclosure. In this embodiment, a double phase change system 901 is shown, that includes a first phase change system 905 and a second phase change system 907 that is in communication with a cooling plate 915 disposed on a processor 909 within a server 903. The first phase change system 905 is a natural force driven phase change system, where internal pressure is used to direct the fluid supply 925 and the vapor return 927 between the phase change system and the cooling plate 915. The second phase change system 907 is a pumped phase change system that utilizes a pump 931 to direct the fluid supply 921 to the cooling plate 915 and the vapor return 923 back to the phase change system 907. As will be appreciated, the phase change systems disclosed herein may include condensers or other phase change components.

While each example shown in FIGS. 7-9 only show two systems, any number of systems can be implemented, and the present disclosure is not limited to a specific number of systems. Similarly, although an alternating pattern with two sets of channels is shown in the accompanying figures, the present disclosure is not limited to a particular arrangement or pattern of channels, or a particular number of sets of channels. For example, three or more systems each having corresponding sets of channels can be implemented with various geometrical patterns, as long as thermal transmission is present between channels of different systems.

Figure 10:
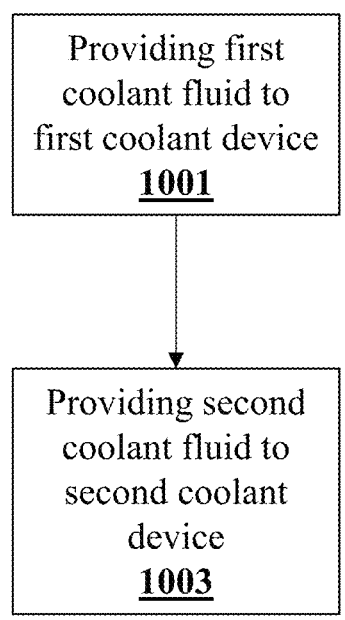
FIG. 10 is a flow chart illustrating a method of operating a server cooling system, according to embodiments of the present disclosure.

FIG. 10 is a flow chart illustrating a method of operating a server cooling system, according to embodiments of the present disclosure. At operation 1001, a first coolant fluid is provided to a first coolant device within the coolant plate. As discussed above, the coolant plate can include two coolant devices with independent fluid systems.

In an embodiment where the first coolant device is a single phase coolant device, providing the first coolant fluid to the first coolant device may include pumping a liquid coolant between the first coolant device and a liquid cooling system.

In an embodiment where the first coolant device is a two-phase coolant device, providing the first coolant fluid to the first coolant device may include directing liquid coolant form a condenser to the first coolant device, and directing vaporized or partially vaporized coolant from the first coolant device to the condenser. In some cases, this can be performed naturally using the pressure generated within a phase change area, or using a fluid pump.

At operation 1003, a second coolant fluid is provided to a second coolant device within the coolant plate. In some embodiments, the first coolant and the second coolant can be provided to their respective coolant devices simultaneously, or one coolant device can operate as a backup for the other coolant device. In some embodiments, the two coolant devices can have the same type of coolant fluid, such as both being single phase liquid coolant devices or both being two-phase coolant devices. In other embodiments, the one of the coolant devices can be a single phase coolant device while the other coolant device is a two-phase coolant device.

According to one aspect of the present disclosure, a thermal management plate is disclosed. The thermal management plate includes a first cooling device including: a first fluid inlet, a first fluid outlet, a first distribution manifold, and a number of first fluid channels extending from the first distribution manifold. The thermal management plate also includes a second cooling device including: a second fluid inlet, a second fluid outlet, a second distribution manifold, and a number of second fluid channels extending from the first distribution manifold, wherein the first fluid channels and the second fluid channels are in thermal communication with each other. In one embodiment, the first fluid channels and second fluid channels are formed from a thermally conductive material, and each of the first fluid channels is in physical contact with at least one of the second fluid channels. In one embodiment, the first fluid channels and second fluid channels are arranged within a single plane. In one embodiment, the first fluid channels and the second fluid channels are arranged in a staggered arrangement, with the first fluid channels extending from the first distribution manifold and between the second fluid channels. In one embodiment, the first cooling device and the second cooling device operate using separate fluid systems. In one embodiment, the first cooling device operates in conjunction with a single phase cooling system, and the second cooling device operates in conjunction with a two-phase cooling system. In one embodiment, the first cooling device and the second cooling device both operate in conjunction with single phase cooling systems. In one embodiment, the first cooling device and the second cooling device both operate in conjunction with two-phase cooling systems. In one embodiment, the first cooling device and the second cooling device are machined from a single base. In one embodiment, the first fluid channels and second fluid channels are in a partially staggered arrangement.

According to another aspect of the present disclosure, a cooling system is disclosed. The system includes a first coolant source; a second coolant source; a first cooling device in fluid communication with the first coolant source, the first coolant device including a first distribution manifold and a number of first fluid channels. The system also includes a second cooling device in fluid communication with the second coolant source, the second coolant device including a second distribution manifold and a number of second fluid channels, wherein the first fluid channels and the second fluid channels are in thermal communication with each other and also in thermal communication with an integrated circuit within a server. In one embodiment, the first cooling device is a single phase cooling device, and the cooling system also includes a liquid cooling system, and a fluid pump. In one embodiment, the first cooling device is a two-phase cooling device, and the cooling system further comprises a condenser. In one embodiment, the first fluid channels and second fluid channels are formed from a thermally conductive material, and each of the first fluid channels is in physical contact with at least one of the second fluid channels. In one embodiment, the first fluid channels and second fluid channels are arranged within a single plane. In one embodiment, the first fluid channels and the second fluid channels are arranged in a staggered arrangement, with the first fluid channels extending from the first distribution manifold and between the second fluid channels. In one embodiment, the first cooling device operates in conjunction with a single phase cooling system, and the second cooling device operates in conjunction with a two-phase cooling system.

According to another aspect of the present disclosure, a method of cooling electronic components is disclosed. The method includes providing a first coolant fluid to a first coolant device; and providing a second coolant fluid to a second coolant device. The first cooling device includes a first fluid inlet, a first fluid outlet, a first distribution manifold, and a number of first fluid channels extending from the first distribution manifold. The second cooling device includes a second fluid inlet, a second fluid outlet, a second distribution manifold, and a number of second fluid channels extending from the first distribution manifold, wherein the first fluid channels and the second fluid channels are in thermal communication with each other. In one embodiment, the first coolant device is a single phase coolant device, and providing the first coolant fluid to the first coolant device includes pumping a liquid coolant between the first coolant device and a liquid cooling system. In one embodiment, the first coolant device is a two-phase coolant device, and providing the first coolant fluid to the first coolant device includes directing a liquid coolant from a condenser to the first coolant device and directing a vaporized or partially vaporized coolant from the first coolant device to the condenser.

One skilled in the art would recognize that various adjustments can be made to the system within the scope of this disclosure. The following clauses and/or examples pertain to specific embodiments or examples thereof. Specifics in the examples may be used anywhere in one or more embodiments. The various features of the different embodiments or examples may be variously combined with some features included and others excluded to suit a variety of different applications. Examples may include subject matter such as a method, means for performing acts of the method, at least one machine-readable medium including instructions that, when performed by a machine cause the machine to performs acts of the method, or of an apparatus or system according to embodiments and examples described herein. Various components can be a means for performing the operations or functions described.

In the foregoing specification, the invention has been described with reference to specific embodiments thereof. However, various modifications and changes can be made thereto without departing from the broader spirit and scope of the invention. The specification and drawings are, accordingly, to be regarded in an illustrative rather than a restrictive sense.

What is claimed is:

1. A thermal management plate, comprising:
   a first cooling device comprising: a first fluid inlet, a first fluid outlet, a first distribution manifold, and a plurality of first fluid channels extending from the first distribution manifold; and
   a second cooling device comprising: a second fluid inlet, a second fluid outlet, a second distribution manifold, and a plurality of second fluid channels extending from the first distribution manifold, wherein the first fluid channels and the second fluid channels are in thermal communication with each other, and wherein the first fluid channels and the second fluid channels are positioned flush on a surface of a die disposed on a chip.

2. The thermal management plate of claim 1, wherein the first fluid channels and second fluid channels are formed from a thermally conductive material, and each of the first fluid channels is in physical contact with at least one of the second fluid channels.

3. The thermal management plate of claim 2, wherein the first fluid channels and second fluid channels are arranged within a single plane.

4. The thermal management plate of claim 3, wherein the first fluid channels and the second fluid channels are arranged in a staggered arrangement, with the first fluid channels extending from the first distribution manifold and between the second fluid channels.

5. The thermal management plate of claim 1, wherein the first cooling device and the second cooling device operate using separate fluid systems.

6. The thermal management plate of claim 5, wherein the first cooling device operates in conjunction with a single phase cooling system, and the second cooling device operates in conjunction with a two-phase cooling system.

7. The thermal management plate of claim 5, wherein the first cooling device and the second cooling device both operate in conjunction with single phase cooling systems.

8. The thermal management plate of claim 5, wherein the first cooling device and the second cooling device both operate in conjunction with two-phase cooling systems.

9. The thermal management plate of claim 1, wherein the first cooling device and the second cooling device are machined from a single base.

10. The thermal management plate of claim 1, wherein the first fluid channels and second fluid channels are in a partially staggered arrangement.

11. A cooling system, comprising:
    a first coolant source;
    a second coolant source;
    a first cooling device in fluid communication with the first coolant source, the first cooling device including a first distribution manifold and a plurality of first fluid channels;
    a second cooling device in fluid communication with the second coolant source, the second cooling device including a second distribution manifold and a plurality of second fluid channels, wherein the first fluid channels and the second fluid channels are in thermal communication with each other and also in thermal communication with an integrated circuit within a server, and wherein the first fluid channels and the second fluid channels are positioned flush on a surface of a die disposed on a chip.

12. The cooling system of claim 11, wherein the first cooling device is a single phase cooling device, and the cooling system further comprises:

a liquid cooling system; and a fluid pump.

13. The cooling system of claim 11, wherein the first cooling device is a two-phase cooling device, and the cooling system further comprises a condenser.

14. The cooling system of claim 11, wherein the first fluid channels and second fluid channels are formed from a thermally conductive material, and each of the first fluid channels is in physical contact with at least one of the second fluid channels.

15. The cooling system of claim 14, wherein the first fluid channels and second fluid channels are arranged within a single plane.

16. The cooling system of claim 15, wherein the first fluid channels and the second fluid channels are arranged in a staggered arrangement, with the first fluid channels extending from the first distribution manifold and between the second fluid channels.

17. The cooling system of claim 11, wherein the first cooling device operates in conjunction with a single phase cooling system, and the second cooling device operates in conjunction with a two-phase cooling system.

18. A method of cooling electronic components, comprising:

providing a first coolant fluid to a first cooling device; and providing a second coolant fluid to a second cooling device, wherein the first cooling device comprises a first fluid inlet, a first fluid outlet, a first distribution manifold, and a plurality of first fluid channels extending from the first distribution manifold; and the second cooling device comprises a second fluid inlet, a second fluid outlet, a second distribution manifold, and a plurality of second fluid channels extending from the first distribution manifold, wherein the first fluid channels and the second fluid channels are in thermal communication with each other, and wherein the first fluid channels and the second fluid channels are positioned flush on a surface of a die disposed on a chip.

19. The method of claim 18, wherein the first cooling device is a single phase cooling device, and providing the first coolant fluid to the first cooling device includes pumping a liquid coolant between the first cooling device and a liquid cooling system.

20. The method of claim 18, wherein the first cooling device is a two-phase cooling device, and providing the first coolant fluid to the first cooling device includes directing a liquid coolant from a condenser to the first cooling device and directing a vaporized or partially vaporized coolant from the first cooling device to the condenser.

* * * * *